United States Patent
Wang et al.

(10) Patent No.: US 7,079,065 B2
(45) Date of Patent: Jul. 18, 2006

(54) DIGITAL-TO-ANALOG CONVERTER AND THE DRIVING METHOD THEREOF

(75) Inventors: Chun-Fu Wang, Hsinchu Hsien (TW); Feng-Ting Pai, Hsinchu (TW)

(73) Assignee: Hannstar Display Corporation, Taipei (TW)

( * ) Notice: Subject to any disclaimer, the term of this patent is extended or adjusted under 35 U.S.C. 154(b) by 0 days.

(21) Appl. No.: 11/050,211

(22) Filed: Feb. 3, 2005

(65) Prior Publication Data

US 2006/0012502 A1    Jan. 19, 2006

(30) Foreign Application Priority Data

Jul. 14, 2004    (TW) .............................. 93121020 A

(51) Int. Cl.
*H03M 1/80* (2006.01)

(52) U.S. Cl. ..................... 341/154; 341/145; 341/144

(58) Field of Classification Search ............... 341/154, 341/145, 144
See application file for complete search history.

(56) References Cited

U.S. PATENT DOCUMENTS

| | | | | | |
|---|---|---|---|---|---|
| 5,703,588 | A | * | 12/1997 | Rivoir et al. | 341/159 |
| 5,969,657 | A | * | 10/1999 | Dempsey et al. | 341/145 |
| 5,999,115 | A | * | 12/1999 | Connell et al. | 341/145 |
| 6,414,616 | B1 | * | 7/2002 | Dempsey | 341/144 |
| 6,433,717 | B1 | * | 8/2002 | Leung | 341/144 |
| 6,567,026 | B1 | * | 5/2003 | Gorman | 341/154 |
| 6,642,877 | B1 | * | 11/2003 | Leung | 341/144 |
| 6,885,328 | B1 | * | 4/2005 | Kao et al. | 341/144 |
| 6,954,165 | B1 | * | 10/2005 | Mallinson | 341/144 |

* cited by examiner

*Primary Examiner*—Linh V. Nguyen
(74) *Attorney, Agent, or Firm*—Thomas, Kayden, Horstemeyer & Risley

(57) ABSTRACT

The present invention describes a circuit and driving method for a digital-to-analog converter to convert an (m+n) bits digital signal to an analog signal. First, the (m+n) bits digital signal is separated into a first set of m first bits and a second set of n second bits. Then, according to the first set of m first bits, a reference voltage range is determined from a plurality of reference voltages. Finally, according to the second set of n second bits, a voltage is determined from the reference voltage range.

17 Claims, 6 Drawing Sheets

DIGITAL-TO-ANALOG CONVERTER AND THE DRIVING METHOD THEREOF

RELATED APPLICATIONS

The present application is based on, and claims priority from, Taiwan Application Serial Number 93121020, filed on Jul. 14, 2004, the disclosure of which is hereby incorporated by reference herein in its entirety.

FIELD OF THE INVENTION

The present invention relates to a circuit and the driving method of a digital-to-analog converter (DAC), and more particularly, to a circuit and the driving method of a digital-to-analog converter in a source driver in a display with high color resolution.

BACKGROUND OF THE INVENTION

An active matrix display means the display uses transistors as switches of pixels. For example, of current displays, the structure of the active matrix display is most extensively used in a thin film transistor liquid crystal display (TFT LCD). The active matrix display comprises a display area of the display, a gate driver circuit, a source driver circuit, and a timing control circuit.

The display area of the display uses the electro-optical property of a certain material to convert an electrical signal to an optical image. The gate driver circuit, also called the scan driver circuit, is used to transmit the on or off signals of the transistors in the display. The source driver circuit, also called the data driver circuit, is used to convert a digital signal to an analog voltage to transmit the image signal to the display. The timing control circuit is used to generate the control signal needed by the gate driver and the source driver. Then, the image signal will be transmitted to the display by the gate driver and the source driver.

For the time being, the structure of the digital-to-analog converter in a conventional source driver is illustrated in FIG. 1. Taking n bits to stand for $2^n$ grey levels as an example, the digital-to-analog converter 100 (DAC 100) in a conventional source driver is composed of $2^n$ switches. Each switch supplies an analog voltage, and the voltage is output from an output buffer 101 to drive a display.

Complex decoders are needed in the design to decode the digital signal to determine the output reference voltage corresponding to the digital signal. Additionally, as illustrated in FIG. 1, addition of one more gray level requires one more switch and one more reference voltage in the DAC 100. With the demands of higher color resolution in displays, more gray levels and switches are needed. Thus, the size of the chip becomes bigger, and the cost to manufacture the source driver also becomes higher.

FIG. 2 illustrates the structure of the digital-to-analog converter in another conventional source driver. In the digital-to-analog converter 200 (DAC 200), every two switches form a switch set, and a plurality of switch sets form a plurality of orders. Each order corresponds to each bit of the digital signal by one-to-one, and each switch of every switch set is controlled by the bit and the complement corresponding to each order. Bus lines supply different reference voltages, and by the different combination of the switches of each order, different voltages will be output to the output buffer 201.

Reference is made to FIG. 2. The source driver transmits an n bit signal 202, in which $B_{n-1}$ is the most significant bit and $B_0$ is the least significant bit. Taking the signal with 5 bits as an example, when $B_0=B_1=B_2=B_3=B_4=1$, the reference voltage of $V_{32}$ is output to the output buffer 201, and the value represented thereby is 31. When $B_0=0$ (i.e. its complement $B_0B=1$) and $B_1=B_2=B_3=B_4=1$, the reference voltage of $V_{31}$ is output to the output buffer 201, and the value represented thereby is 30. No complex decoders are needed in the design to decode the digital signal to determine the output reference voltage corresponding to the digital signal. Therefore, the decoder in the DAC 200 is simpler than that in the DAC 100 in FIG. 1.

Table 1 lists the comparison of the amount of the switches and reference voltages in the DAC 100 in FIG. 1 and the DAC 200 in FIG. 2. From Table 1, although the decoder in the DAC 200 in FIG. 2 is simpler than that in the DAC 100 in FIG. 1, more switches are needed in DAC 200 than in DAC 100.

TABLE 1

|  | The decoders of switches | The amount of reference voltages | The amount of bus lines | The amount of switches |
|---|---|---|---|---|
| DAC 100 in FIG. 1 | Complex | $2^n$ | $2^n$ | $2^n$ |
| DAC 200 in FIG. 2 | Simple | $2^n$ | $2^n$ | $2^{n+1}$ |

As can be seen from the table above, in the structure of the digital-to-analog converter in conventional source drivers, when the demands for higher color resolution in displays is higher, the needed switches, reference voltages, and the bus lines supplying reference voltages are doubled exponentially with the increase of the bits.

SUMMARY OF THE INVENTION

Hence, an objective of the present invention is to provide a digital-to-analog converter, in which the amount of the bus lines and the switches is decreased and the design of the circuit is simplified to minimize the size of the chip and lower the manufacturing cost.

Another objective of the present invention is to provide a method for digital analog conversion to lower the complexity of the circuit of the digital-to-analog converter and to increase effectively the ability in digital analog conversion.

According to the aforementioned objectives, the present invention provides a digital-to-analog converter suitable for converting a digital signal with m+n bits to a voltage. The digital-to-analog converter comprises a plurality of bus lines, a first circuit, and a second circuit. The bus lines supply a plurality of reference voltages. The first circuit has m first bit of the digital signal, and is electrically connected to the bus lines to receive the reference voltages to choose a reference voltage range from the reference voltages. The second circuit has n second bit of the digital signal and at least an input, in which the input is connected to the first circuit to receive the reference voltage range and choose a voltage for output to a buffer.

According to the preferred embodiment of the present invention, the first circuit comprises a first sub-circuit and a second sub-circuit, and each of the sub-circuit receives part of the reference voltages, respectively, to determine the largest value and the smallest value of the reference voltage range. The second circuit comprises a plurality of voltage-dividing circuits electrically connected in series and a second resistor electrically series-wound to the voltage-dividing circuits. Each voltage-dividing circuit comprises a switch and a first resistor. Each voltage-dividing circuit corresponds one-to-one to the second bits and the complement, and the switch of each voltage-dividing circuit is controlled by the second bit or the complement of the second bit corresponding to the switch. The value of the first resistors decrease gradually in order according to the sequence of the second bits or the complement corresponding to the first resistors, and the values of the first resistors corresponding to two adjacent second bits or the complement are multiplicative.

Each sub-circuit comprises a plurality of voltage-dividing circuits electrically series-wound to a first reference voltage connected to the sub-circuit, and a second resistor electrically series-wound between the voltage-dividing circuits and a second reference voltage connected to the sub-circuit. Each voltage-dividing circuit comprises a switch and a first resistor. Each voltage-dividing circuit corresponds one-to-one to the first bits and the complement, and the switch of each voltage-dividing circuit is controlled by the first bit or the complement of the first bit corresponding to the switch. The value of the first resistors decrease gradually in order according to the sequence of the first bits or the complement corresponding to the first resistors, and the values of the first resistors corresponding to two adjacent first bits or the complement are multiplicative.

According to another objective of the present invention, the present invention provides a method for digital analog conversion suitable for converting a digital signal with (m+n) bits to a voltage. The method for digital analog conversion comprises the following steps. First, the digital signal with (m+n) bits is separated into a first set of m first bits and a second set of n second bits. Then, a reference voltage range is determined from a plurality of reference voltages according to the first set of m first bits. Then, the voltage is determined from the reference voltage range according to the second set of n second bits.

The reference voltages have a plurality of first reference voltages and a plurality of second reference voltages to determine the largest value and the smallest value of the reference voltage range, respectively. The method further comprises determining the largest value and the smallest value of the reference voltage range by using the order and the complement or the voltage-dividing resistance and the complement produced by the first set.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The present invention provides a circuit and the driving method of a digital-to-analog converter in a source driver. A digital image signal is converted to an analog voltage and then output to an output buffer to drive the display. Therefore, the circuit of the present invention does not need complex decoders, needs fewer switches, and further can overcome the disadvantage of conventional digital-to-analog converters where the needed switches, voltages, and the bus lines supplying voltages are doubled exponentially with the increase of the demands of higher color resolution.

The present invention divides the digital-to-analog converter of the source driver into two parts. One is a first circuit, which chooses a reference voltage range from the reference voltages, and the other is a second circuit, which chooses a voltage from the reference voltage range. In order to decrease the switches, the input digital signal of (m+n) bits is separated into a first set of m first bits and a second set of n second bits, in which the first set of m first bits determines the largest value and the smallest value of the reference voltage range and the second set of n second bits chooses a corresponding voltage from the reference voltage range.

In order to make clear the following embodiments, a digital signal of 10 bits is taken as an example. The first circuit corresponds to the five first bits of the digital signal ($B_9B_8B_7B_6B_5$, which represents $2^9 2^8 2^7 2^6 2^5$, respectively), and the second circuit corresponds to the five second bits of the digital signal ($B_4B_3B_2B_1B_0$, which represents $2^4 2^3 2^2 2^1 2^0$, respectively). 10 bits means 1024 gray levels, of which the voltages are denoted as $V_0$–$V_{1023}$. The structure can be expanded to any number of bits.

Figure 3:
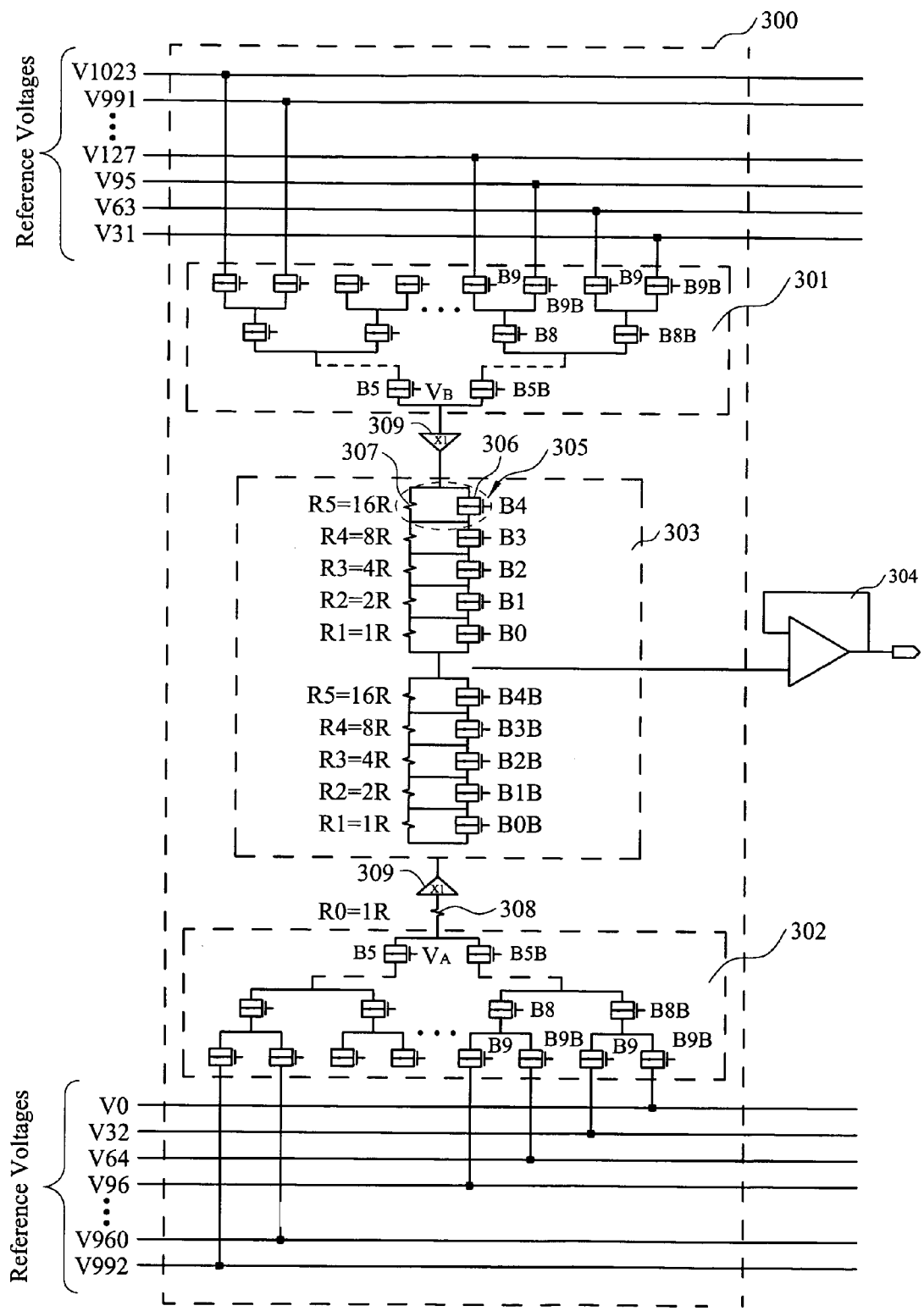
FIG. 3 illustrates the block diagram of the circuit of the digital-to-analog converter in the source driver of the present invention.

Reference is made to FIG. 3 illustrating the circuit of the digital-to-analog converter in the source driver of the present invention. As shown in FIG. 3, the digital-to-analog converter 300 of the present invention comprises a first circuit and a second circuit 303. The first circuit comprises a first sub-circuit 301 and a second sub-circuit 302. Each sub-circuit electrically connects to part of the reference voltages, respectively, to determine the largest value, such as $V_B$, and the smallest value, such as $V_A$, of the reference voltage range, in which the voltage of $V_B$ is chosen from $V_{31}$–$V_{1023}$ as shown in FIG. 3 and the voltage of $V_A$ is chosen from $V_0$–$V_{992}$ as shown in FIG. 3. The second circuit 303 chooses a voltage from the reference voltage range for output to an output buffer 304. Taking the input signal of 10 bits as an example, the first sub-circuit 301 and the second sub-circuit 302 determine the largest value and the smallest value (such as $V_B$ and $V_A$) of the digital-to-analog converter 300, and the second circuit 303 chooses a voltage from the reference voltage range (from $V_B$ to $V_A$).

In the digital-to-analog converter 300, each sub-circuit comprises a plurality of switches electrically connecting to part of the reference voltages. Two switches form a switch set and the switch sets form a plurality of orders. Each order corresponds to the first bit by one-to-one, and the switches of each switch set are controlled by the first bit and the complement corresponding to the orders, respectively. Different reference voltages supplied by bus lines are output by the different combination of the switches of each order. Then, the largest value $V_B$ and the smallest value $V_A$ of the reference voltage range are determined by the first circuit.

For example, when $B_5=B_6=B_7=B_8=B_9=0$, $V_A$ outputs the voltage of $V_0$ and $V_B$ outputs the voltage of $V_{31}$. When $B_5=1$ (i.e. its complement $B_5B=0$) and $B_6=B_7=B_8=B_9=0$, $V_A$ outputs the voltage of $V_{32}$ and $V_B$ outputs the voltage of $V_{63}$. When $B_6=1$ (i.e. its complement $B_6B=0$) and $B_5=B_7=B_8=B_9=0$, $V_A$ outputs the voltage of $V_{64}$ and $V_B$ outputs the voltage of $V_{95}$.

The second circuit 303 comprises a plurality of voltage-dividing circuits 305 electrically connected in series and a second resistor 308 electrically series-wound to the voltage-dividing circuits 305. Each of the voltage-dividing circuit 305 comprises a switch 306 and a first resistor 307. Each voltage-dividing circuit 305 corresponds one-to-one to each second bit and the complement, and the switch 306 of each voltage-dividing circuit 305 is controlled by the second bit or the complement of the second bit corresponding to the switch 306. The value of the first resistors decrease gradually in order according to the sequence of the second bits or the complement corresponding to the first resistors, and the values of the first resistors 307 corresponding to two adjacent second bits or the complement are multiplicative.

The switch 306 and the first resistor 307 in the voltage-dividing circuit 305 are connected in parallel. When the switch 306 is off, the current goes through the first resistor 307. Contrarily, when the switch 306 is on, the current goes through the switch 306 and the first resistor 307 does not work. With different arrangement and combination of switches and resistors, different relative resistances are produced and further, different output voltages are produced. As seen from the truth table shown in Table 2, the digital-to-analog converter 300 of the present invention converts the digital image signal to analog voltage by the switches and resistors, and outputs the analog voltage via the output buffer 304 to drive a display (not shown in the drawing). Moreover, the unit gain buffer 309 aims to prevent the distortion of the output voltage resulting from dividing the severe voltage by the resistors of too many orders.

Figure 4:
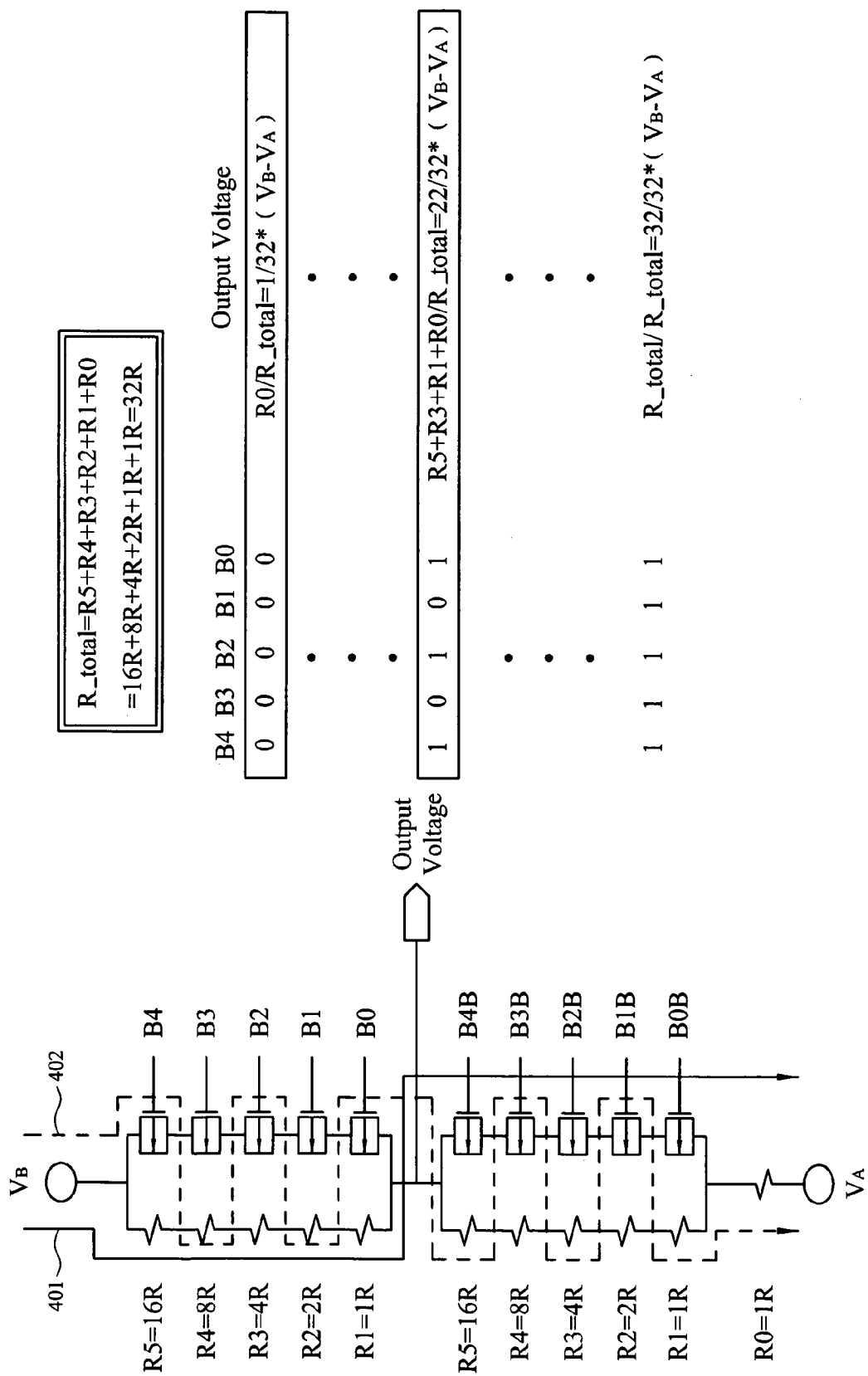
FIG. 4 illustrates the principle of the second circuit in the digital-to-analog converter of the present invention.

Reference is made to FIG. 4 illustrating the principle of the second circuit in the digital-to-analog converter of the present invention. Taking the second circuit with 5 bits as an example, when the switch $B_4$, the switch $B_3$, the switch $B_2$, the switch $B_1$ and the switch $B_0$ are 0 (off), the current goes as the path 401. The relative resistance output from the digital-to-analog converter is $R_0/R\_total$, and the output voltage is $R_0/R\_total*(V_B-V_A)$, which represents the value 0. When the switch $B_4$, the switch $B_2$, and the switch $B_0$ are 1 (on), and the switch $B_3$ and the switch $B_1$ are 0 (off), the current follows the path 402. The relative resistance output from the digital-to-analog converter is $(R_5+R_3+R_1+R_0)/R\_total$, and the output voltage is $(R_5+R_3+R_1+R_0)/R\_total*(V_B-V_A)$, which represents the value 21. The complete truth table of the digital signal vs. the output voltage is shown in Table 2. The voltage of $V_B$ is one of $V_{31}$–$V_{1023}$, as shown in FIG. 3, and the voltage of $V_A$ is one of $V_0$–$V_{992}$, as in FIG. 3.

TABLE 2

| Value | $B_4$ | $B_3$ | $B_2$ | $B_1$ | $B_0$ | The relative value of resistance | |
|---|---|---|---|---|---|---|---|
| 0 | 0 | 0 | 0 | 0 | 0 | $R_0/R\_total$ | $*(V_B-V_A)$ |
| 1 | 0 | 0 | 0 | 0 | 1 | $R_1 + R_0/R\_total$ | $*(V_B-V_A)$ |
| 2 | 0 | 0 | 0 | 1 | 0 | $R_2 + R_0/R\_total$ | $*(V_B-V_A)$ |
| 3 | 0 | 0 | 0 | 1 | 1 | $R_2 + R_1 + R_0/R\_total$ | $*(V_B-V_A)$ |
| 4 | 0 | 0 | 1 | 0 | 0 | $R_3 + R_0/R\_total$ | $*(V_B-V_A)$ |
| 5 | 0 | 0 | 1 | 0 | 1 | $R_3 + R_1 + R_0/R\_total$ | $*(V_B-V_A)$ |
| 6 | 0 | 0 | 1 | 1 | 0 | $R_3 + R_2 + R_0/R\_total$ | $*(V_B-V_A)$ |
| 7 | 0 | 0 | 1 | 1 | 1 | $R_3 + R_2 + R_1 + R_0/R\_total$ | $*(V_B-V_A)$ |
| 8 | 0 | 1 | 0 | 0 | 0 | $R_4 + R_0/R\_total$ | $*(V_B-V_A)$ |
| 9 | 0 | 1 | 0 | 0 | 1 | $R_4 + R_1 + R_0/R\_total$ | $*(V_B-V_A)$ |
| 10 | 0 | 1 | 0 | 1 | 0 | $R_4 + R_2 + R_0/R\_total$ | $*(V_B-V_A)$ |
| 11 | 0 | 1 | 0 | 1 | 1 | $R_4 + R_2 + R_1 + R_0/R\_total$ | $*(V_B-V_A)$ |
| 12 | 0 | 1 | 1 | 0 | 0 | $R_4 + R_3 + R_0/R\_total$ | $*(V_B—V_A)$ |
| 13 | 0 | 1 | 1 | 0 | 1 | $R_4 + R_3 + R_1 + R_0/R\_total$ | $*(V_B-V_A)$ |
| 14 | 0 | 1 | 1 | 1 | 0 | $R_4 + R_3 + R_2 + R_0/R\_total$ | $*(V_B-V_A)$ |
| 15 | 0 | 1 | 1 | 1 | 1 | $R_4 + R_3 + R_2 + R_1 + R_0/R\_total$ | $*(V_B-V_A)$ |
| 16 | 1 | 0 | 0 | 0 | 0 | $R_5 + R_0/R\_total$ | $*(V_B-V_A)$ |
| 17 | 1 | 0 | 0 | 0 | 1 | $R_5 + R_1 + R_0/R\_total$ | $*(V_B-V_A)$ |
| 18 | 1 | 0 | 0 | 1 | 0 | $R_5 + R_2 + R_0/R\_total$ | $*(V_B-V_A)$ |
| 19 | 1 | 0 | 0 | 1 | 1 | $R_5 + R_2 + R_1 + R_0/R\_total$ | $*(V_B-V_A)$ |
| 20 | 1 | 0 | 1 | 0 | 0 | $R_5 + R_3 + R_0/R\_total$ | $*(V_B-V_A)$ |
| 21 | 1 | 0 | 1 | 0 | 1 | $R_5 + R_3 + R_1 + R_0/R\_total$ | $*(V_B-V_A)$ |
| 22 | 1 | 0 | 1 | 1 | 0 | $R_5 + R_3 + R_2 + R_0/R\_total$ | $*(V_B-V_A)$ |
| 23 | 1 | 0 | 1 | 1 | 1 | $R_5 + R_3 + R_2 + R_1 + R_0/R\_total$ | $*(V_B-V_A)$ |
| 24 | 1 | 1 | 0 | 0 | 0 | $R_5 + R_4 + R_0/R\_total$ | $*(V_B-V_A)$ |
| 25 | 1 | 1 | 0 | 0 | 1 | $R_5 + R_4 + R_1 + R_0/R\_total$ | $*(V_B-V_A)$ |
| 26 | 1 | 1 | 0 | 1 | 0 | $R_5 + R_4 + R_2 + R_0/R\_total$ | $*(V_B-V_A)$ |
| 27 | 1 | 1 | 0 | 1 | 1 | $R_5 + R_4 + R_2 + R_1 + R_0/R\_total$ | $*(V_B-V_A)$ |
| 28 | 1 | 1 | 1 | 0 | 0 | $R_5 + R_4 + R_3 + R_0/R\_total$ | $*(V_B-V_A)$ |
| 29 | 1 | 1 | 1 | 0 | 1 | $R_5 + R_4 + R_3 + R_1 + R_0/R\_total$ | $*(V_B-V_A)$ |
| 30 | 1 | 1 | 1 | 1 | 0 | $R_5 + R_4 + R_3 + R_2 + R_0/R\_total$ | $*(V_B-V_A)$ |
| 31 | 1 | 1 | 1 | 1 | 1 | $R_5 + R_4 + R_3 + R_2 + R_1 + R_0/R\_total$ | $*(V_B-V_A)$ |

Figure 5:
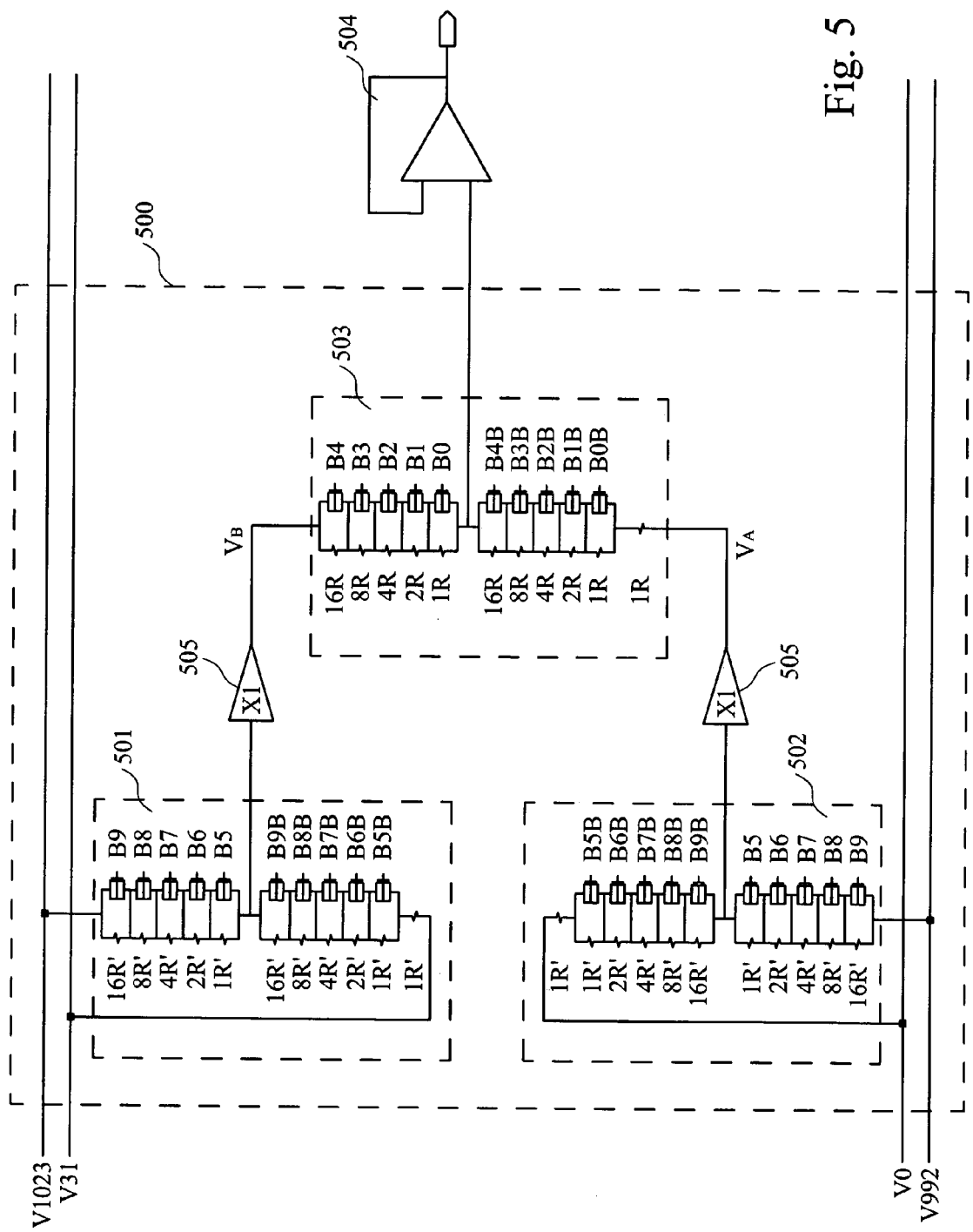
FIG. 5 illustrates the structure of the digital-to-analog converter in another embodiment of the present invention.

FIG. 5 illustrates the structure of the digital-to-analog converter in another embodiment of the present invention. Resistors and switches are further connected in parallel in the first circuit. As shown in FIG. 5, the digital-to-analog converter 500 of the present invention comprises a first circuit and a second circuit 503. The first circuit comprises a first sub-circuit 501 and a second sub-circuit 502. Each sub-circuit electrically connects to part of the reference voltages, respectively, to determine the largest value, such as $V_B$, and the smallest value, such as $V_A$, of the reference voltage range. The second circuit 503 chooses a voltage from the reference voltage range for output to an output buffer 504. The unit gain buffer 505 aims to prevent the distortion of the output voltage resulting from dividing the severe voltage by the resistors of too many orders.

In the digital-to-analog converter 500, the first sub-circuit 501 comprises a plurality of voltage-dividing circuits electrically connected in series and a second resistor. The voltage-dividing circuits are electrically series-wound to a reference voltage $V_{1023}$ connected to the first sub-circuit 501, and the second resistor is electrically series-wound between the voltage-dividing circuits and a reference voltage $V_{31}$ connected to the first sub-circuit 501. Similarly, the second sub-circuit 502 also comprises a plurality of voltage-dividing circuits electrically connected in series and a second resistor. The voltage-dividing circuits are electrically series-wound to a reference voltage $V_{992}$ connected to the second sub-circuit 502, and the second resistor is electrically series-wound between the voltage-dividing circuits and a reference voltage $V_0$ connected to the second sub-circuit 502. Each of the voltage-dividing circuit comprises a switch and a first resistor. Each voltage-dividing circuit corresponds one-to-one to each first bit and the complement, and the switch of each voltage-dividing circuit is controlled by the first bit or the complement of the first bit corresponding to the switch. The value of the first resistors decrease gradually in order according to the sequence of the first bits or the complement corresponding to the first resistors, and the values of the first resistors corresponding to two adjacent first bits or the complement are multiplicative.

With different arrangement and combination of switches and resistors, different output voltages will be produced. For example, in the first sub-circuit 501 and the second sub-circuit 502, with the arrangement and combination of switches and resistors, a voltage $V_B$ between $V_{1023}$ and $V_{31}$ and a voltage $V_A$ between $V_0$ and $V_{992}$ will then be output. The principle of the second circuit 503 is the same as that of the second circuit 303 in FIG. 3.

Figure 6:
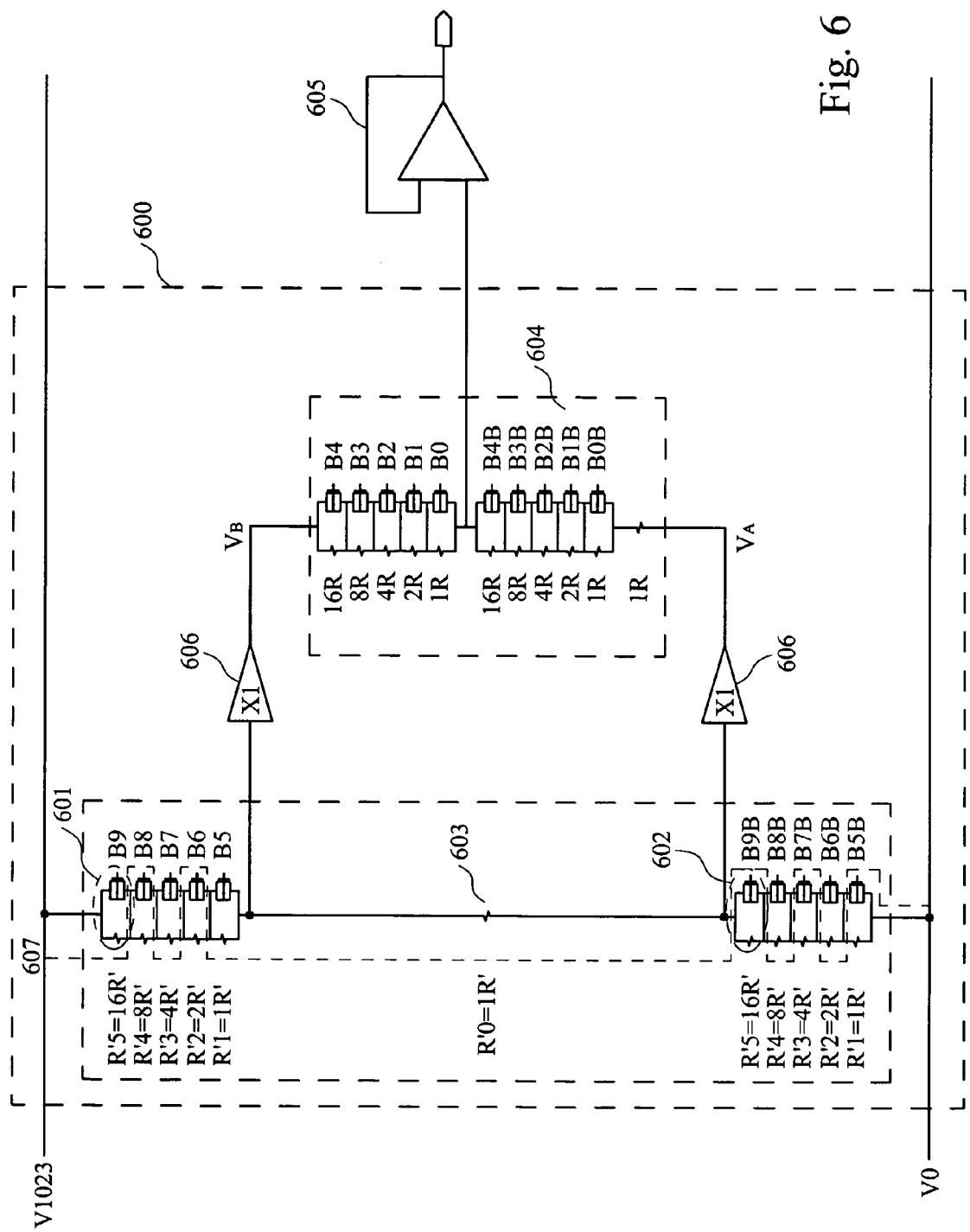
FIG. 6 illustrates the structure of the digital-to-analog converter in another embodiment of the present invention.

FIG. 6 illustrates the structure of the digital-to-analog converter in another embodiment of the present invention. As shown in FIG. 6, the digital-to-analog converter 600 of the present invention comprises a first circuit and a second circuit 604. When the bus lines only supply two reference voltages, the first circuit comprises a plurality of first voltage-dividing circuits 601, a plurality of second voltage-dividing circuits 602, and a third resistor 603. The second circuit 604 is the same as that of the second circuit 303 in FIG. 3. The first circuit determines the largest value, such as $V_B$, and the smallest value, such as $V_A$, of the reference voltage range. The second circuit 604 chooses a voltage from the reference voltage range to output to an output buffer 605. The unit gain buffer 606 aims to prevent the distortion of the output voltage resulting from the severe voltage dividing by the resistors of too many orders.

The first voltage-dividing circuit 601 is electrically series-wound to a reference voltage $V_{1023}$, and each of the first voltage-dividing circuit 601 comprises a first switch and a first resistor. The first voltage-dividing circuit 601 corresponds one-to-one to each first bit, and the switch of each first voltage-dividing circuit 601 is controlled by the first bit corresponding to the switch. The second voltage-dividing circuit 602 is electrically series-wound to a reference voltage $V_0$, and each of the second voltage-dividing circuit 602 comprises a second switch and a second resistor. The second voltage-dividing circuit 602 corresponds one-to-one to each complement of the first bit, and the switch of each second voltage-dividing circuit 602 is controlled by the complement of the first bit corresponding to the switch. The third resistor is electrically series-wound between the first and the second voltage-dividing circuits.

The values of the first resistors gradually decrease in order according to the sequence of the first bits corresponding to the first resistors, and the value of the second resistors gradually decrease in order according to the sequence of the complement of the first bits corresponding to the second resistors. The values of the first resistors corresponding to two adjacent first bits are multiplicative, and the value of the second resistors corresponding to two adjacent complement of the first bits are also multiplicative.

The following describes the principle of the digital-to-analog converter 600. Assume $V_0$–$V_{1023}$ represents 1024 gray levels, i. e. a digital signal with 10 bits. Then, as the truth table in Table 2 and the path 607 in FIG. 6 show, if $B_9B_8B_7B_6B_5$ is 01010, the output voltage of $V_B$ is $(R_2'+R_4'+R_0')/R'\_total*(V_{1023}-V_0)$ and the output voltage of $V_A$ is $(R_2'+R_4')/R'\_total*(V_{1023}-V_0)$, in which $R'\_total=R_0'+R_1'+R_2'+R_3'+R_4'+R_5'$, and the voltage difference between $V_B$ and $V_A$ is at the both ends of $R_0'$. After setting up the complete truth table and substituting for the value of $R_0'$–$R_5'$, the results of $V_B$ and $V_A$, which are the same as that in FIG. 5, are obtained.

From the embodiments and the conventional technique above, the comparison of the amounts of switches and reference voltages in the digital-to-analog converters in FIG. 1, FIG. 2, FIG. 3, FIG. 5, and FIG. 6 are listed in Table 3.

TABLE 3

Figure 1:
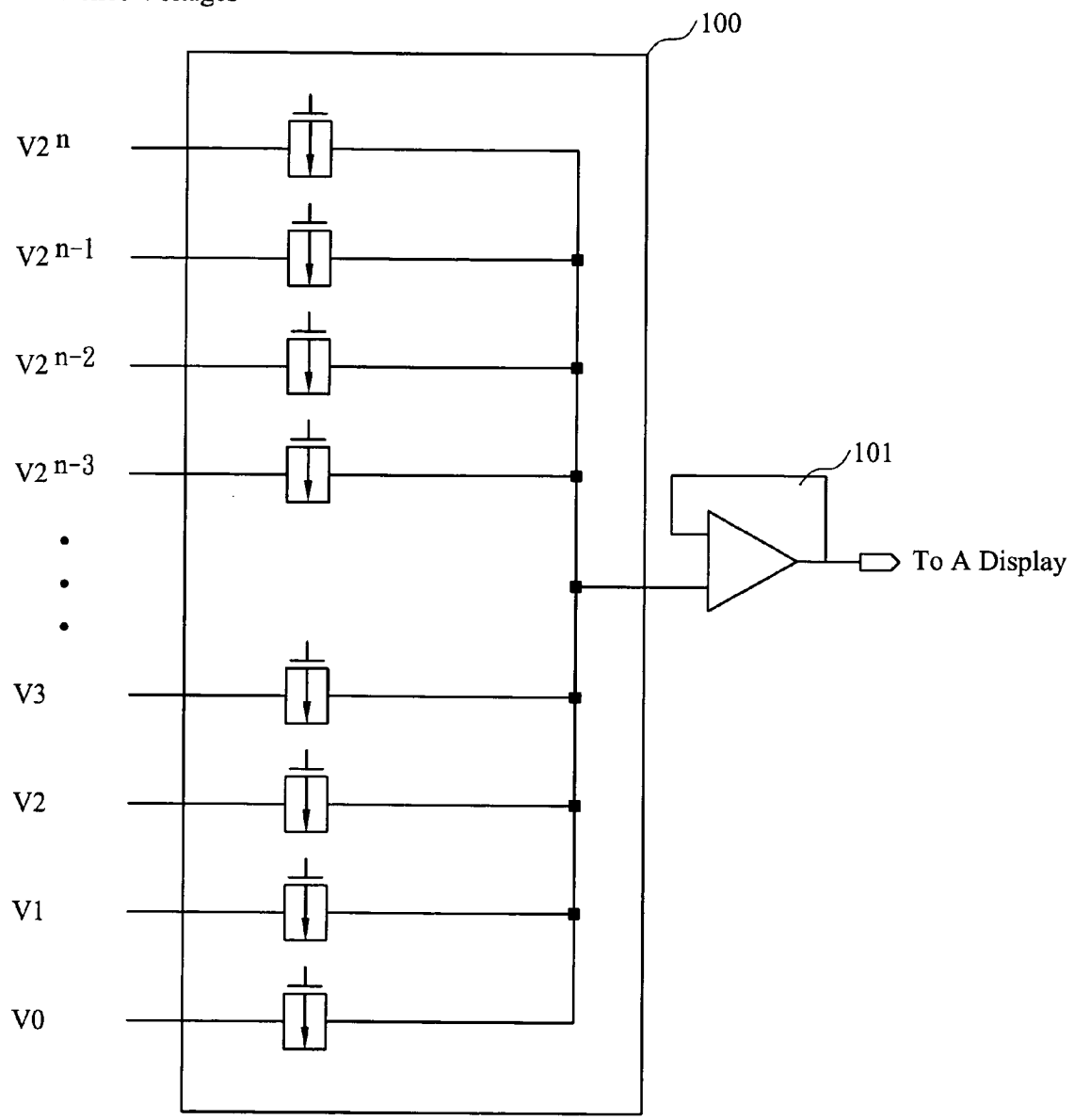
FIG. 1 illustrates the structure of the digital-to-analog converter in a conventional source driver.
Figure 2:
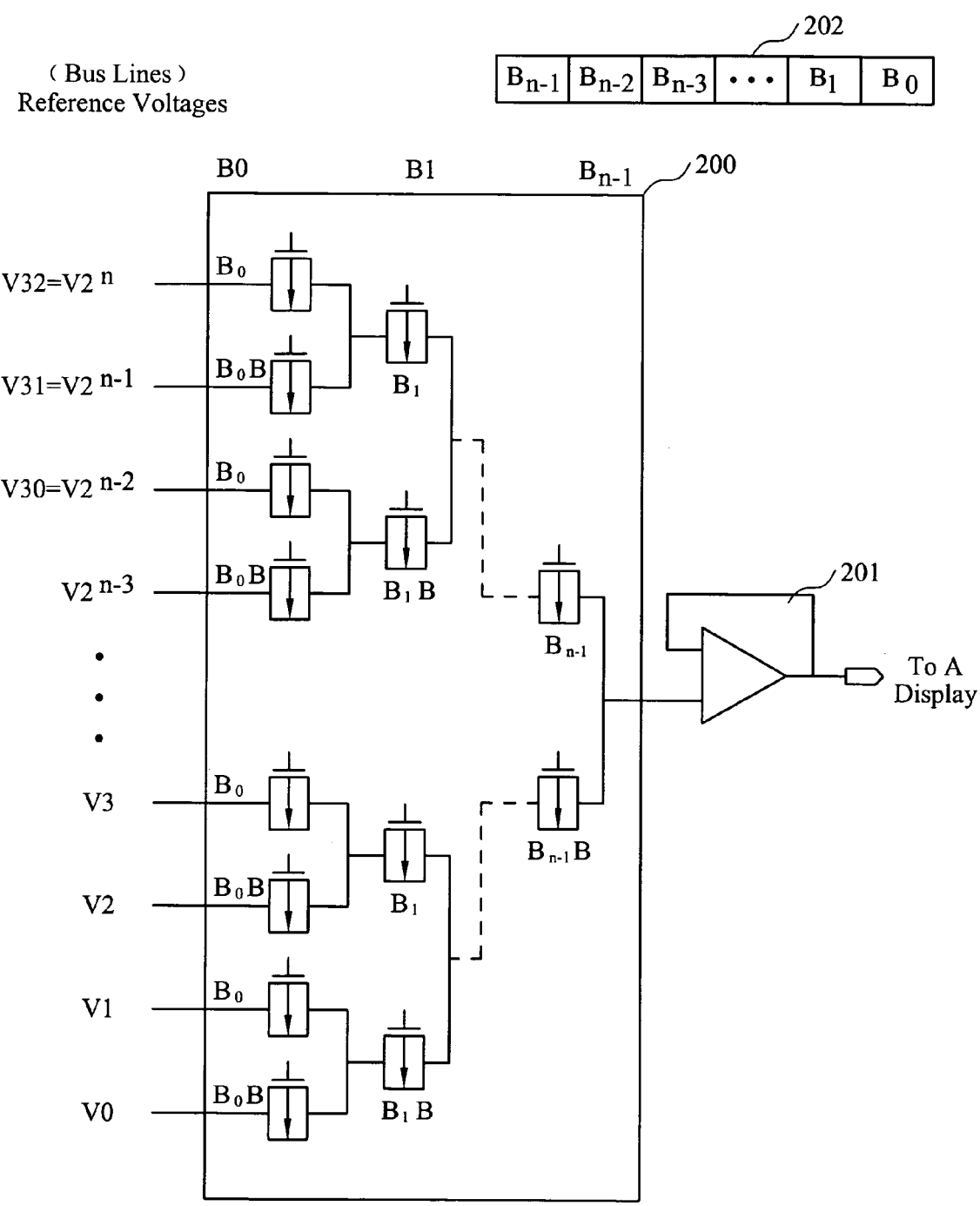
FIG. 2 illustrates the structure of the digital-to-analog converter in another conventional source driver.

| | The decoders of switches | The amount of reference voltages | The amount of bus lines | The amount of switches | The amount of resistors |
|---|---|---|---|---|---|
| DAC 100 in FIG. 1 | Complex | 1024 | 1024 | 1024 | — |
| DAC 200 in FIG. 2 | Simple | 1024 | 1024 | 2048 | — |
| DAC 300 in FIG. 3 | Simple | 64 | 64 | 64 + 10 | 11 |
| DAC 500 in FIG. 5 | Simple | 4 | 4 | 30 | 33 |
| DAC 600 in FIG. 6 | Simple | 2 | 2 | 20 | 22 |

From Table 3 above, it is understood that fewer switches are used in the digital-to-analog converter of the present invention to achieve higher color resolution, so the size of the source driver will be smaller and the cost of manufacturing the chip can be lowered. Furthermore, from Table 3, it is also understood that the elements including switches and bus lines and the complexity of decoders are decreased, so the disadvantage of the conventional source driver can be overcome.

As is understood by a person skilled in the art, the foregoing preferred embodiments of the present invention are illustrative of the present invention rather than limiting of the present invention. It is intended that various modifications and similar arrangements are covered within the spirit and scope of the appended claims, the scope of which should be accorded the broadest interpretation so as to encompass all such modifications and similar structures.

What is claimed is:

1. A digital-to-analog converter, adapted to converting a digital signal with m+n bits to a voltage, the digital-to-analog converter comprising:
    a plurality of bus lines, supplying a plurality of reference voltages;
    a first circuit, having m first bits of the digital signal, the first circuit electrically connecting to the bus lines to receive the reference voltages and choosing a reference voltage range from the reference voltages; and
    a second circuit, having n second bits of the digital signal, the second circuit having at least an input, wherein the input is connected to the first circuit to receive the reference voltage range and choose the voltage to output to a buffer, and the second circuit further comprising:
        a plurality of voltage-dividing circuits, electrically connected in series, wherein each of the voltage-dividing circuits comprises a first switch and a first resistor and the first switch and the first resistor are connected in parallel; and
        a second resistor, electrically series-wound to the voltage-dividing circuits;
        wherein the voltage-dividing circuits correspond one-to-one to the second bits and the complement, and the first switch of each voltage-dividing circuit is controlled by a second bit or a complement of the second bit corresponding to the first switch.

2. The digital-to-analog convener of claim 1, wherein the first circuit comprises a first sub-circuit and a second sub-circuit, and each of the sub-circuits receives part of the reference voltages, respectively, to determine the largest value and the smallest value of the reference voltage range.

3. The digital-to-analog converter of claim 2, wherein each of the sub-circuit comprises a plurality of switch sets forming a plurality of orders and each of the switch set has two switches controlled by a first bit and a complement corresponding to the orders, respectively.

4. The digital-to-analog converter of claim 2, wherein each of the sub-circuits comprises:
   a plurality of voltage-dividing circuits, electrically series-wound to a first reference voltage connected to the sub-circuit, wherein each of the voltage-dividing circuits comprises a second switch and a third resistor; and
   a fourth resistor, electrically series-wound between the voltage-dividing circuits and a second reference voltage connected to the sub-circuit;
   wherein the second switch of each voltage-dividing circuit is controlled by a first bit or a complement of the first bit corresponding to the second switch.

5. The digital-to-analog convener of claim 4, wherein values of the third resistors gradually decrease in order according to a sequence of the first bits or the complement corresponding to the first resistors.

6. The digital-to-analog converter of claim 4, wherein values of the third resistors corresponding to two adjacent first bits or the complement are multiplicative.

7. The digital-to-analog converter of claim 1, wherein when the bus lines supply two reference voltages, the first circuit comprises:
   a plurality of first voltage-dividing circuits, electrically series-wound to a first reference voltage, wherein each of the first voltage-dividing circuits comprises a second switch and a third resistor and the second switch is controlled by a first bit corresponding to the second switch;
   a plurality of second voltage-dividing circuits, electrically series-wound to a second reference voltage, wherein each of the second voltage-dividing circuits comprises a third switch and a fourth resistor and the third switch is controlled by a complement of the first bit corresponding to the third switch; and
   a fifth resistor, electrically series-wound between the first voltage-dividing circuits and the second voltage-dividing circuits.

8. The digital-to-analog converter of claim 7, wherein values of the third resistors gradually decrease in order according to a sequence of the first bits corresponding to the third resistors, and values of the fourth resistors gradually decrease in order according to a sequence of the complement of the first bits corresponding to the fourth resistors.

9. The digital-to-analog converter of claim 7, wherein values of the third resistors and the fourth resistors corresponding to two adjacent first bits and the complement, respectively, are multiplicative.

10. The digital-to-analog converter of claim 1, wherein values of the first resistors decrease gradually in order according to a sequence of the second bits or the complement corresponding to the first resistors.

11. The digital-to-analog converter of claim 1, wherein values of the first resistors corresponding to two adjacent second bits or the complement are multiplicative.

12. A method for digital analog conversion, adapted to converting a digital signal with (m+n) bits to a voltage, the method for digital analog conversion comprising:
   separating the digital signal with (m+n) bits into a first set of m first bits and a second set of n second bits;
   determining a reference voltage range from a plurality of reference voltages according to the first set of m first bits; and
   determining the voltage from the reference voltage range according to the second set of n second bits, wherein step of determining the voltage is perform by a circuit comprising: a plurality of voltage-dividing circuits, electrically connected in series, wherein each of the voltage-dividing circuit comprises a first switch and a first resistor and the first switch and the first resistor are connected in parallel; and a second resistor, electrically series-wound to the voltage-dividing circuits; wherein the voltage-dividing circuit corresponding one-to-one to the second bits and the complement, and the first switch of each voltage-dividing circuit is controlled by a second bit or a complement of the second bit corresponding to the first switch.

13. The method for digital analog conversion of claim 12, wherein the reference voltages have a plurality of first reference voltages and a plurality of second reference voltages to determine a largest value and a smallest value of the reference voltage range, respectively.

14. The method for digital analog conversion of claim 12, wherein the method further comprises determining a largest value and a smallest value of the reference voltage range by using an order and a complement produced by the first set.

15. The method for digital analog conversion of claim 12, wherein the method further comprises determining a largest value and a smallest value of the reference voltage range by using a voltage-dividing resistor and a complement produced by the first set.

16. The method for digital analog conversion of claim 15, wherein values of the resistors decrease gradually in order according to a sequence of the first bits or the complement corresponding to the resistors.

17. The method for digital analog conversion of claim 15, wherein values of the resistors corresponding to two adjacent first bits or the complement arc multiplicative.

* * * * *